United States Patent
Washiya et al.

(10) Patent No.: US 8,770,965 B2
(45) Date of Patent: Jul. 8, 2014

(54) DEVICE AND METHOD FOR TRANSFERRING MICRO STRUCTURE

(75) Inventors: Ryuta Washiya, Hitachi (JP); Masahiko Ogino, Hitachi (JP); Noritake Shizawa, Ninomiya (JP); Kyoichi Mori, Oiso (JP); Akihiro Miyauchi, Hitachi (JP)

(73) Assignee: Hitachi High-Technologies Corporation, Tokyo (JP)

( * ) Notice: Subject to any disclaimer, the term of this patent is extended or adjusted under 35 U.S.C. 154(b) by 117 days.

(21) Appl. No.: 13/370,413

(22) Filed: Feb. 10, 2012

(65) Prior Publication Data
US 2012/0205838 A1   Aug. 16, 2012

(30) Foreign Application Priority Data
Feb. 10, 2011   (JP) .................. 2011-026646

(51) Int. Cl.
B29C 35/08   (2006.01)
(52) U.S. Cl.
USPC ............ 425/385; 264/496; 264/293; 977/887
(58) Field of Classification Search
USPC .......................................... 425/385; 977/887
See application file for complete search history.

(56) References Cited

U.S. PATENT DOCUMENTS

| | | | | |
|---|---|---|---|---|
| 2007/0104813 | A1* | 5/2007 | Wuister et al. ............. | 425/174.4 |
| 2011/0014499 | A1* | 1/2011 | Uchida et al. ................ | 428/846 |

FOREIGN PATENT DOCUMENTS

| | | |
|---|---|---|
| JP | 2004-351693 | 12/2004 |
| JP | 2008-168447 | 7/2008 |
| JP | 2009-001002 | 1/2009 |
| JP | 2009-143221 | 7/2009 |
| JP | 2010-5972 | 1/2010 |
| JP | 2010-069730 | 4/2010 |
| JP | 2010-092941 | 4/2010 |
| JP | 2010-141064 | 6/2010 |
| JP | 2010-280159 | 12/2010 |
| WO | WO 2008/146542 | 12/2008 |

OTHER PUBLICATIONS

Ge et al., Cross-linked Polymer Replica of a Nanoimprint Mold at 30 nm Half-pitch, Nano Letters, vol. 5, No. 1 (2005), pp. 179-182.*
NIST website, http://physics.nist.gov/PhysRefData/Handbook/Tables/mercurytable3.htm, retrieved Sep. 16, 2013, 2 pages.*
Japanese Office Action, dated Apr. 2, 2013, with English language translation thereof.

* cited by examiner

Primary Examiner — Matthew Daniels
(74) Attorney, Agent, or Firm — Antonelli, Terry, Stout & Kraus, LLP.

(57) ABSTRACT

A microstructure transferring device is characterized in that the device comprises a stamper made from a first photo-curable resin composition cured with light with a first wavelength, and a light source emitting light with a second wavelength longer than the first wavelength. The microstructure is transferred to an impression receptor supplied with a second photo-curable resin composition, which is curable with light with the second wavelength emitted by the light source.

17 Claims, 5 Drawing Sheets

DEVICE AND METHOD FOR TRANSFERRING MICRO STRUCTURE

CROSS REFERENCE TO RELATED APPLICATION

The present application claims priority from Japanese Patent Application No. 2011-026646 filed on Feb. 10, 2011, the disclosure of which is incorporated herein by reference.

The present invention relates to a microstructure transferring device and a microstructure transferring method for forming a microstructure on a substrate.

DESCRIPTION OF THE RELATED ART

Conventionally the technology of photolithography is widely used as a vital technology of the micro-patterning process for a semiconductor device. As the scale of patterning becomes increasingly finer, however, the photolithography finds difficulty in meeting the requirement for a process dimension as microscopic as the scale of a wavelength of light used for exposure. In consequence, the electron beam lithography device, a kind of charged-particle-beam generator, is substituting the conventional photolithography device.

Unlike the conventional one-shot exposure patterning using such a light source as an i-line generator or an excimer laser, the patterning that utilizes an electron-beam adopts a method of directly drawing a mask pattern. The downside of the method of direct drawing is that the more the number of the drawn patterns increases, the longer is the exposure time making the pattern drawing more time-consuming. An increasing degree of integration of a semiconductor integrated circuit requires a longer time for patterning, and may produce a low throughput.

For an acceleration of an electron beam lithography device operation, a development of the one-shot object exposure method, in which an electron beam is formed into a complex shape by exposing to an electron beam a combination of masks of various shapes at once, has been attempted. As the scale of patterning becomes increasingly finer, however, a high cost of the device due to the requirement for a large size device and for a high precision control of the mask positioning poses disadvantages.

Alternatively, a microstructure transformation technology is known as an application of the nanoimprinting method, which enables a high precision patterning at low cost. In the technology, a micropattern is transferred to resin. More specifically, the employed stamper has microscopic surface asperities, which is formed in accordance with the microscopic asperities of a desired micropattern, and embossed on the resin supplied to an impression receptor by, for example, an application process.

Especially, when the employed stamper is optically transparent, a photo-curable resin supplied to an impression receptor may be cured by exposing the supplied photo-curable resin to light coming from a light source such as a high pressure mercury lamp or an LED, and passing through the optically transparent stamper before reaching the resin while the stamper's microscopic asperities is embossed on the supplied resin. Therefore, with an optically transparent stamper, production of a high precision pattern in a short time is attainable. The formation of a memory bits pattern in a large capacity storage or of a pattern of a semiconductor integrated circuit is now an expected application of such microstructure transferring technology, also known as a nanoimprinting technology.

A hard stamper such as quartz is a conventional, well-known optically transparent stamper often used in the microstructure transferring technology. Such hard stamper as quartz, however, in a transferring process, is unable to strictly conform to such microscopic unevenness as a warp or a protrusion inherent in the impression receptor, and may generate an area of a poor image transfer of a large scale. A reduction of such area of a poor image transfer requires a stamper, which can adapt to the microscopic unevenness of the inherent warp and protrusion of the impression receptor supplied with the photo-cure resin composition.

Accordingly, a resin stamper, which can strictly conform to both of a warp and a protrusion of the impression receptor, is proposed (Refer to, for example, JP2010-005972A, JP2009-001002A and JP2004-351693A). The inherent flexibility of the resin stamper effectively prevents a poor image transfer. Especially, a resin stamper comprising a resin layer of a photo-curable resin can form an imaging pattern in a higher precision at a lower cost than a stamper with a thermoplastic resin layer.

LIST OF PRIOR ART DOCUMENTS

Patent Documents

JP2010-005972A
JP2009-001002A
JP2004-351693A

SUMMARY OF THE INVENTION

Nowadays, as the nanoimprinting technology is finding ever more widening range of application, a scale of an impression transferred to an impression receptor is tending larger. The large scale of the transferred impression inevitably increases the thickness of the resin layer of the resin stamper in order to meet the demand for the stamper's even more excellent conformablity to the impression receptor.

The increased thickness of the resin layer, however, decreases the stamper's transmittance of light, to which the photo-curable resin at the impression receptor is exposed, therefore making the curing process of the photo-curable resin more time-consuming, which means a low throughput of a microstructure transfer process.

The shorter is a wavelength of the emitted light passing through the resin stamper before reaching a photo-curable resin composition, the more efficient becomes a curing process of the photo-curable resin. The shorter wavelength of the passing light, however, also lowers the stamper's transmittance of the light, and inflicts a greater damage on the resin constituting the resin stamper, namely on the resin's organic functional groups. Such downside is more enhanced when the stamper is supplied for a repeated use. On the other hand, a longer wavelength of the passing light means less damage on the resin stamper as well as the stamper's higher transmittance of the light. The diminished photo energy, however, of the light, to which the photo-curable resin at the impression receptor is exposed, decreases the efficiency of the curing process of the photo-curable resin, resulting in a low throughput.

Moreover, the resin stamper having a lowered transmittance of the light due to the increased thickness of the resin layer undergoes a thermal expansion due to the photo energy of the passing light absorbed by the resin layer, which is more likely to lower precision in the image transfer or in the mask positioning.

Therefore, in the microstructure transferring technology, such technology is desired as featuring a resin stamper with an adequate light transmittance and an excellent fidelity of microstructure transfer, achieving a good throughput, and preventing degradation of the resin stamper.

An objective of the present invention is to provide a device and a method for transferring microstructure featuring a resin stamper with an adequate transmittance of light and an excellent fidelity of microstructure transfer, achieving a good throughput, and preventing degradation of the resin stamper.

Means to Attain the Objective

A microstructure transferring device of the present invention to attain the aforementioned objective is a device, for transferring a microstructure to a photo-curable resin composition supplied to an impression receptor comprising: a stamper having the microstructure, being pressed against a second photo-curable resin composition supplied to the impression receptor; and being removed from the supplied second photo-curable resin composition after cured; and a light source emitting a second wavelength light, whose wavelength is longer than a first wavelength, the second wavelength light being capable of curing the second photo-curable resin composition, and passing through the stamper to the second photo-curable resin composition while the stamper is being pressed against the second photo-curable resin composition supplied to the impression receptor in order to cure the supplied second photo-curable resin composition, wherein the stamper is formed by pressing, against a first photo-curable resin composition, a master stamper having the microstructure, by curing the first photo-curable resin composition by exposing the first photo-curable resin composition to light with the first wavelength, and by removing the master stamper from the cured first photo-curable resin composition.

A microstructure transferring method of the present invention to attain the aforementioned objective is a method for transferring a microstructure to an impression receptor by supplying a photo-curable resin composition to the impression receptor, then curing the supplied photo-curable resin composition by exposing the supplied photo-curable resin composition to light passing through a stamper before reaching the supplied photo-curable resin composition while the stamper is pressed against the supplied photo-curable resin composition, and removing the pressed stamper from the cured photo-curable resin composition, wherein the method comprises: a first step of forming the stamper by pressing, against a first photo-curable resin composition, a master stamper having the microstructure, curing the first photo-curable resin composition by exposing the first photo-curable resin composition to light with a first wavelength, and removing the master stamper from the cured first photo-curable resin composition; a second step of supplying the impression receptor with a second photo-curable resin composition, which is curable by exposing the second photo-curable resin composition to light with a second wavelength longer than the first wavelength; a third step of curing the supplied second photo-curable resin composition by exposing the supplied second photo-curable resin composition to light with the second wavelength passing through the stamper formed in the first step before reaching the supplied second photo-curable resin composition while the stamper is pressed against the second photo-curable resin composition supplied to the impression receptor; and a fourth step of removing the pressed stamper from the cured second photo-curable resin composition.

Advantages of the Invention

The present invention provides a device and a method for transferring microstructure featuring a resin stamper with an adequate transmittance of light and an excellent fidelity of microstructure transfer, achieving a good throughput, and preventing degradation of the resin stamper.

DETAILED DESCRIPTION OF THE PREFERRED EMBODIMENT

Now, embodiments of the present invention are described in detail with reference to the drawings whenever it is appropriate. Hereinafter, a device and a method for transferring a microstructure will be described in this order.

<Microstructure Transferring Device>

Figure 1:
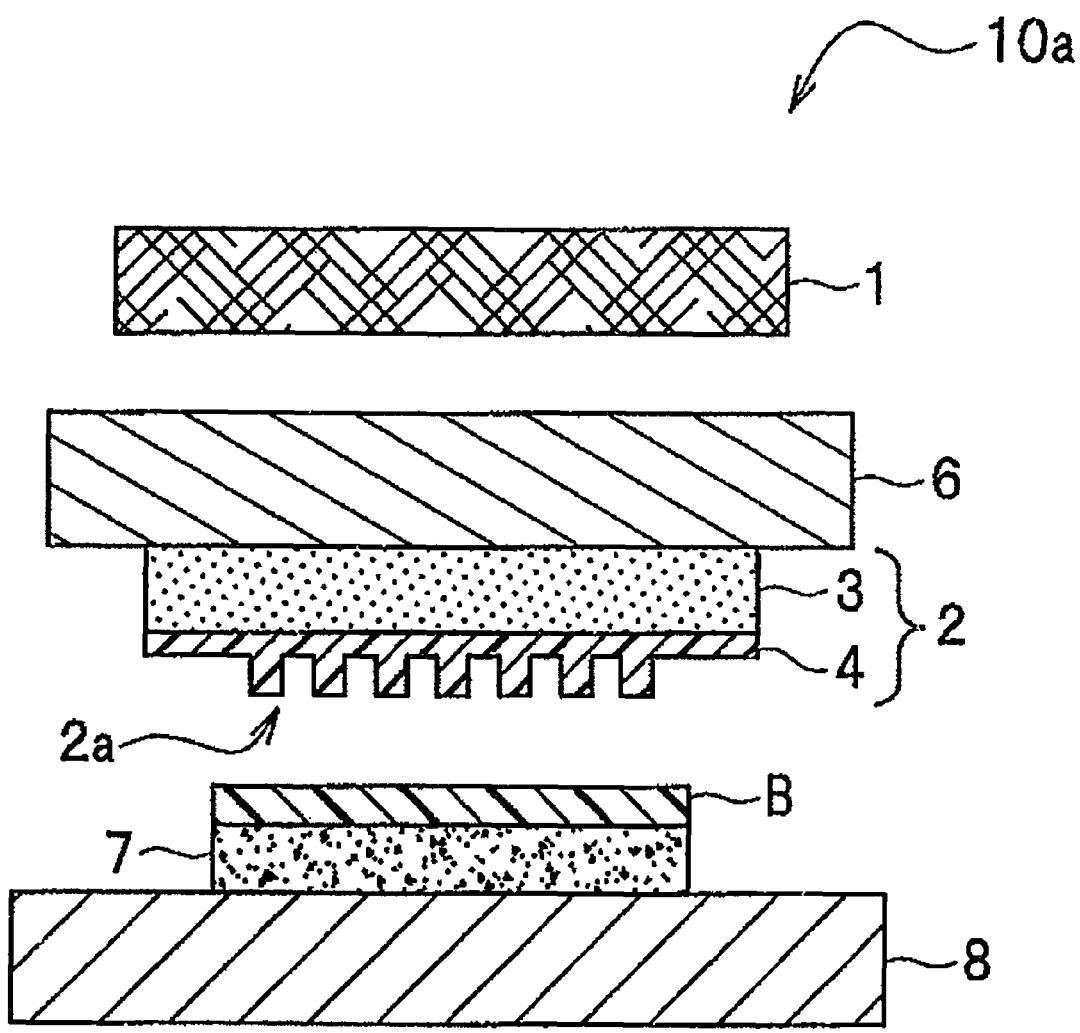
FIG. 1 is an explanatory view of a configuration of a microstructure transferring device of an embodiment of the present invention.

As illustrated in FIG. 1, a microstructure transferring device 10a of the present embodiment comprises a resin stamper 2, an impression receptor 7, a light source 1, a plate 6, and a stage 8. The resin stamper 2 is optically transparent and has a microstructure 2a. The impression receptor 7 is supplied with a photo-curable resin composition B, which is applied to the receptor 7, and to which a microstructure is transferred from the microstructure 2a of the resin stamper 2. The light source 1 emits light passing through the resin stamper 2 before reaching the photo-curable resin composition to expose the photo-curable resin composition B with the light. The plate 6 is optically transparent and is disposed on the rear face of the resin stamper 2 to press the resin stamper 2 against the photo-curable resin composition B at the impression receptor 7. The stage 8 disposes the impression receptor 7 to be opposed to the resin stamper 2. It should be noted that the plate 6 is referred to as "pressing member" and the photo-curable resin composition B as "second photo-curable resin composition" in the claims.

As illustrated in FIG. 1, the resin stamper 2 mainly comprises a substrate 3 and a resin layer 4, which is disposed on the substrate 3 and has the microstructure 2a.

The microstructure 2a of the resin stamper 2 refers to a formed structure of a size between nanometers and micrometers. A dot pattern comprising a plurality of regularly disposed microscopic protrusions, or conversely, of regularly disposed microscopic concaves, and a lamella pattern, also known as a line-and-space pattern, comprising a plurality of regularly disposed lines are some specific examples of the microstructure 2a. Such microstructure 2a is formed on a surface of the resin layer 4 of a cured resin made of the photo-curable resin composition A (refer to FIG. 2A), which is later described.

The substrate 3, the photo-curable resin composition A, and the microstructure 2a of the resin stamper 2 will be described in detail in a later description of a method for transferring a microstructure.

There is no specific limitation on materials for the impression receptor 7 as long as the materials meet the requirement for a mechanical strength and a finishing accuracy of the receptor 7. Silicon wafer, various metallic materials, glass, quartz, ceramic, and resins are some examples of the material for the receptor 7.

Additionally, on a surface of the impression receptor 7, a thin metallic film or an adhesive layer may be formed to enhance the adhesiveness with a cured resin made of the photo-curable resin composition B.

The photo-curable resin composition B applied to the impression receptor 7 will be described in detail in a later description of a method for transferring a microstructure.

Figure 2C:
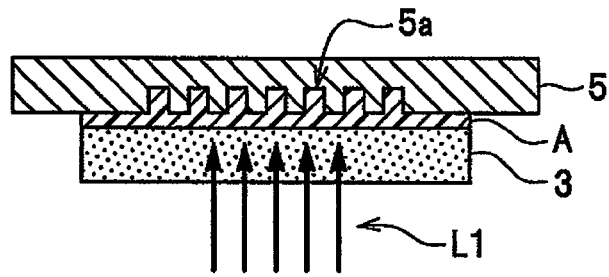
Figure 3A:
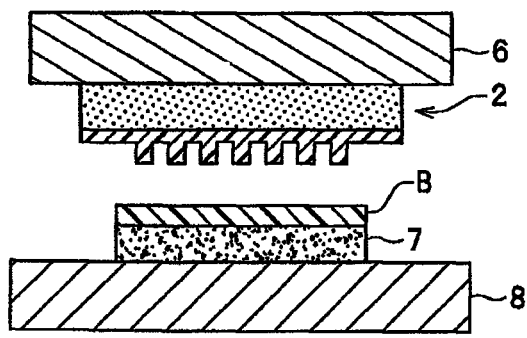
FIGS. 3A-D are schematic explanatory views illustrating steps in a method for transferring a microstructure.
Figure 3B:
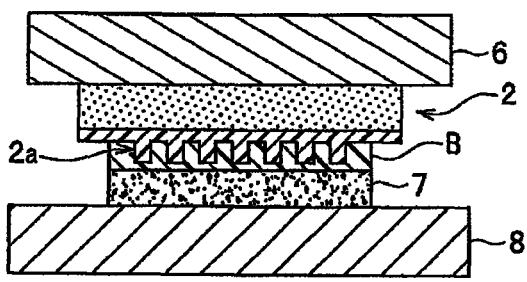
Figure 3C:
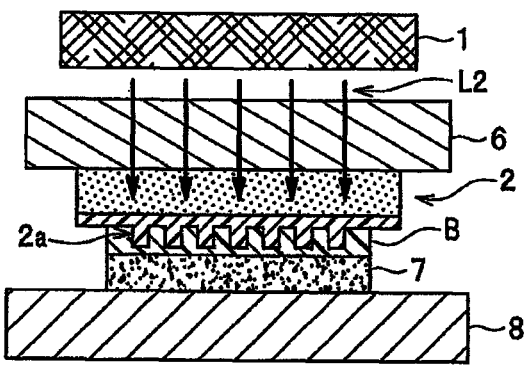

The light source 1 is configured to emit light L2 with a wavelength referred to as a second wavelength in the claims (refer to FIG. 3C). As described in detail later, the second wavelength is selected so as to be longer than a wavelength of light L1 (refer to FIG. 2C), referred to as a first wavelength in the claims, with which the photo-curable resin composition A is cured to form the resin layer 4 of the resin stamper 2.

Therefore, an example of the light source 1 illustrated in FIG. 1 is selected so as to emit light with a wavelength longer than 365 nm in accordance with the wavelength of 365 nm of light, with which the photo-resin composition A (refer to FIG. 2C) is cured to form the resin layer 4 (refer to FIG. 2D) with the microstructure 2a. It should be noted that, hereinafter, the wavelength of light having a broad wavelength distribution is represented by the peak wavelength in the corresponding optical spectrum.

There is no specific limitation on wavelengths of the second wavelength as long as the second wavelength is longer than the first wavelength. Nevertheless, a difference between the selected first and second wavelength is preferably equal to or more than 10 nm, more preferably equal to or more than 25 nm. More specifically, the selected second wavelength is preferably 375 nm or longer, more preferably 390 nm or longer. Additionally, the upper limit of the second wavelength may be selected from the range of wavelengths, with which the photo-curable resin composition B is curable, taking into consideration a range of wavelengths, with which a good throughput of the microstructure 2a transfer is attainable.

Although a high pressure mercury lamp conventionally used for a light source for curing a photo-curable resin may be employed as the light source 1 of the present embodiment, an LED light source (an LED lamp) is preferable for the light source 1. Unlike a high pressure mercury lamp marked by such disadvantages as an ozone generation, an emitting device tending to be large, and a short life of the lamp, an LED light source is advantageous for its compactness, a small room for installation, a long life of the lamp, and an easy specification of the one emitting light with a desired wavelength.

A consideration of a broad wavelength characteristic of an LED light source makes a light source 1 emitting light with a peak wavelength of 390 nm or longer a preferable choice.

An employment of light with a wavelength of 390 nm or longer brings less degradation to the plate 6, to resin stamper 2, and to their peripheral members, therefore, widening a range of options of members, which may contribute to the cost reduction. Especially, light with a wavelength between 390 nm and 405 nm is preferred in view of a high transmittance and an excellent throughput.

In view of efficiency in a curing process, a preferred illuminance of the light source 1 is 10 mWcm$^{-2}$ or more.

As mentioned before, the plate 6 is disposed on a rear face of the resin stamper 2, in other wards, on a face opposite the microstructure 2a across the resin stamper 2 (on the side closer to the light source 1), and comprises a board-like body.

Glass, quartz, and resin are some examples of materials for the plate 6. Moreover, the plate 6 may be configured to be single-layered or multi-layered. Each of the plurality of layers may be made of a material different from the materials for of the rest of the layers. An elastic material may be also employed for the plate 6.

The plate 6 should have a high transmittance of light emitted by the light source 1 (the light with the second wavelength), and preferably has a transmittance of 80% or more of light with the second wavelength emitted by the light source 1.

More specifically, the plate 6 is preferably made of a material absorbing light with a wavelength of around 365 nm, and having a high transmittance of light with a wavelength of 375 nm or longer, preferably 390 nm or longer.

The plate 6 may also be provided with an optical filter not illustrated in the drawings. An optical filter affording a high transmittance of light with the second wavelength emitted by the light source 1 while absorbing light with the shorter wavelength of, for example, around 365 nm is one example of a optical filter. A use of an optical filter can prevent the light with the shorter wavelength from degrading the resin layer 4 of the resin stamper 2.

There is no specific limitation on the location of a provided optical filter as long as the filter is located between the resin stamper 2 and the light source 1. Nevertheless, the optical filter is preferably disposed on the plate 6's face opposed to the light source 1 when the employed plate 6 is made from resin. An optical filter provided in this position contributes to a prevention of degradation not only of the resin layer 4 but also of the plate 6.

Such a plate 6 supports the resin stamper 2 to be disposed opposite to the impression receptor 7. Such a conventional means as, for example, a vacuum suction or a mechanical anchor is used as a support means.

As illustrated in FIG. 1, the stage 8 supports the impression receptor 7 so that the photo-curable resin composition B applied to the receptor 7 may be disposed opposite to the resin layer 4 with the microstructure 2a of the resin stamper 2. Such a conventional means as a vacuum suction or a mechanical anchor are some examples of a support means.

Such a microstructure transferring device 10a is provided with a hoisting-lowering means, not illustrated in the drawings, at either the plate 6 or the stage 8, or at both members. The means presses the resin stamper 2 on the impression receptor 7 keeping them parallel to each other, and then, separates them from each other.

The microstructure transferring device 10a may be also provided with an application means, not illustrated in the drawings, which applies the photo-curable resin composition B to the impression receptor 7. There is no specific limitation on application means as long as the means can apply the photo-resin composition B to the impression receptor 7, and means with such dispensing process as the inkjet process, the spray process, and the spin coat process can be used for the application means for the photo-curable resin composition B. Among those examples, an application means employing the spin coat process is preferable because this application means can form a thin film of the photo-curable resin composition B evenly on a surface of the impression receptor 7.

The application means may be installed separately outside the microstructure transferring device 10a.

<Microstructure Transferring Method>

Now a method for transferring a microstructure of the present embodiment is described. The method for transferring a microstructure comprises: a first step of forming a resin stamper 2 by curing a photo-curable resin composition A (a first photo-curable resin composition) with light with a first wavelength; a second step of supplying the impression receptor 7 with a photo-curable resin composition B (a second photo-curable resin composition); a third step of curing the supplied photo-curable resin composition B by exposing the supplied photo-curable resin composition B with light to a second wavelength passing through the resin stamper 2 before reaching the photo-curable resin composition B while the resin stamper 2 is pressed against the photo-curable resin composition B supplied to the impression receptor 7; and a fourth step of removing the pressed resin stamper 2 from the cured photo-curable resin composition B.

FIGS. 2A-D, referred to in the following description, are schematic explanatory views illustrating steps in a method for forming a resin stamper.

Figure 2A:
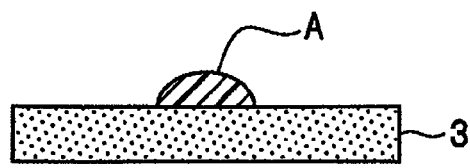
FIGS. 2A-D are schematic explanatory views illustrating steps in a method for forming a resin stamper comprised in the microstructure transferring device of FIG. 1.
Figure 2B:
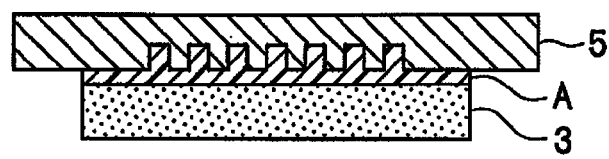

Firstly, as illustrated in FIG. 2A, in the method for forming a resin stamper, the photo-curable resin composition A is applied on a surface of a substrate 3 of a prepared resin stamper 2.

Figure 2D:
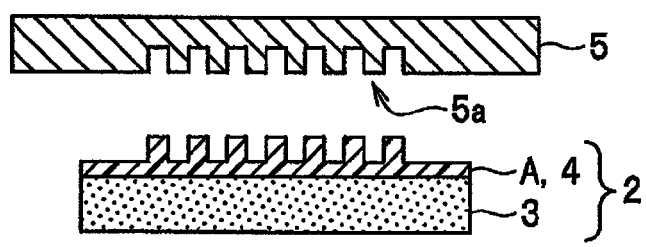

There is no specific limitation on a shape, a material, a size, and a manufacturing process of the substrate 3 as long as the substrate 3 is capable of sustaining the resin layer 4 (refer to FIG. 2D).

The substrate 3 may be made into a shape of a tow-dimensional circle, square, or rectangle.

Optically transparent materials are used for materials for substrate 3. Specifically, glass, quartz, and resin are preferable because of their mechanical strength and processability.

Additionally, a surface treatment may be applied on a surface of the substrate 3 to enhance the adhesive strength between the substrate 3 and the resin layer 4.

The substrate 3 may also be made of more than one kind of layers, which may have elastic moduli different from each other. There is no specific limitation on combinations, orders, and the number of high and low modulus layers in a lamination. A lamination comprising layers of more than one kind of optically transparent materials, for example, a combination of a resin layer made from a resin and a non-resin layer made from glass or quartz, and a combination of resin layers both made from resins are some examples of the substrate 3 comprising more than one kind of layer.

Some specific examples of the resins forming the substrate 3 are phenol formaldehyde resin (PF), urea formaldehyde resin (UF), melamine formaldehyde resin (MF), polyethylene terephthalate (PET), unsaturated polyester (UP), alkyd resin, vinyl ester resin, epoxy resin (EP), polyimide (PI), polyurethane (PUR), polycarbonate (PC), polystyrene (PS), acrylic resin, polyamide (PA), ABS resin, AS resin, AAS resin, polyvinyl alcohol, polyethylene (PE), polypropylene (PP), polytetrafluoroethylene (PTFE), polyalylate, cellulose acetate, polyethylene naphthalate (PEN), polybutylene terephthalate (PBT), polyphenylene sulfide (PPS), polyphenylen oxide, cycloolefin polymer, polylactic acid, silicone resin, and diallyl phthalate resin. Any of these resins may be used either solely or in combination with one or more of any other resins.

<<Photo-curable Resin Composition A>>

A photo-curable resin composition A is preferably cured with light with a wavelength of around 365 nm. More preferably, the preferable photo-curable resin composition A is not cured or hardly cured with light with a wavelength of 375 nm or longer, or even preferably 390 nm or longer.

Some examples of photo-curable resins contained in the photo-curable resin composition A are resins having, a methacryloyl group, a vinyl group, an epoxy group, or an oxetanyl group. Especially, a resin having an epoxy group or an oxetanyl group is preferable.

The photo-curable resin composition A may contain one or more of photo-curable resins having those reactive functional groups in the molecular structure.

In order to prevent light absorption in the resin, a cured resin made of the photo-curable resin of the photo-curable resin composition A preferably contains as little functional groups having double bonds like alkylene group or phenyl group as possible. Specifically, a preferable cured resin made of the photo-cured resin of the photo-cured resin composition A contains carbon-carbon chemical bonds, 5% or less of which are double bonds.

Some examples of the photo-curable resins having a terminal methacrylate group are modified acryl alicyclic epoxide, difunctional alcohol epoxide, acrylsilicone, acryldimethylsiloxane, apart from polymethylmethacrylate, ethoxylated bisphenol-A methacrylate, aliphatic urethanemethacrylate, polyester methacrylate, polyethyleneterephthalate, polystyrene, and polycarbonate. Any of these photo-curable resins may be used either solely or in combination with one or more of any other photo-curable resins.

A monomer may also be used. Some examples of monomers having a terminal methacrylate or vinyl group are methoxytriethylene glycol methacrylate, methoxypolyethylene glycol methacrylate, isobornylmethacrylate, octoxypolyethyleneglycol methacrylate, 2-hydroxy-3-phenoxypropyl methacrylate, isostearyl methacrylate, lauryl methacrylate, 1,10-decanediol dimethacrylate, cyclodecanedimethanol dimethacrylate, ethoxylated 2-methyl-1,3-propanediol dimethacrylate, neopentylglycol dimethacrylate, 2-hydroxy-3-acryloxypropyl methacrylate, 1,6-hexanediol dimethacrylate, 1,9-nonanediol dimethacrylate, dipropyleneglycol dimethacrylate, tripropyleneglycol dimethacrylate, polypropyleneglycol dimethacrylate, ethyleneglycol dimethacrylate, polyethyleneglycol dimethacrylate, triethyleneglycol dimethacrylate, tetraethyleneglycol dimethacrylate, ethoxylated isocyanuric acid dimethacrylate, ethoxylated trimethylolpropane trimethacrylate, trimethylolpropane trimethacrylate, propoxylated trimethylolpropane trimethacrylate, pentaerythritol trimethacrylate, ethoxylated pentaerythritol tetramethacrylate, ditrimethylolpropane tetramethacrylate, propoxylated pentaerythritol tetramethacrylate, pentaerythritol tetramethacrylate, dipentaerythritol hexamethacrylate, cyclohexyl methacrylate, cyclopentanyl methacrylate, cyclopentenyl methacrylate, and adamantyl methacrylate. Any of these monomers may be used either solely or in combination with one or more of any other monomers.

Some examples of the monomers having a terminal epoxide group are alicyclic epoxide, modified alicylic epoxide, bisphenol-A-type epoxide, hydrogenated bisphenol-A-type epoxide, bisphenol-F-type epoxide, novolac type epoxide, naphthalene-type epoxide, biphenyl-type epoxide, difunctional-alcohol-ether-type epoxide, 1,6-hexanediolglycidyl ether, 1,4-butanediolglycidyl ether, epoxysilicone, and epoxysilsesquioxane. Any of these monomers may be used either solely or in combination with one or more of any other monomers.

Some examples of the monomers having a terminal oxetanyl group are 3-ethyl-3-hydroxymethyl oxetane, 1,4-bis[(3- ethyl-3-oxetanylmethoxy)methyl]benzene, 3-ethyl-3-(phenoxymethyl)oxetane, di[1-ethyl (3-oxetanyl)]methyl ether, 3-ethyl-3-(2-ethylhexyloxymethyl)oxetane, 3-ethyl-3-{[3-(triethoxysilyl)propoxy]methyl}oxetane, oxetanylsylsesquioxane, and phenolnovolac oxetane. Any of these monomers may be used either solely or in combination with one or more of any other monomers.

Some examples of the monomers having a terminal vinyl group are ethyleneglycol divinyl ether, diethyleneglycol divinyl ether, triethyleneglycol divinyl ether, tetraethyleneglycol divinyl ether, butanediol divinyl ether, hexanediol divinyl ether, cyclohexanedimethanol divinyl ether, isophthalic acid bis[(4-vinyloxy)butyl]ester, glutaric acid bis[(4-vinyloxy) butyl]ester, succinic acid bis[(4-vinyloxy)butyl]ester, trimethyrolpropanetrivinyl ether, 2-hydroxyethyl vinyl ether, hydroxybutyl vinyl ether, hydroxyhexyl vinyl ether, vinyl silicone, and vinylsilsesquioxane. Any of these monomers may be used either solely or in combination with one or more of any other monomers.

The aforementioned illustration of the monomer components having one of functional groups of epoxy group, oxetanyl group, and vinylether group should not be taken as limiting the monomer components used in the above-mentioned examples.

The photo-curable resin composition A contains a photo-polymerization initiator A'.

As a photo-polymerization initiator A' initiating a chemical reaction by the reactive functional groups, initiators shown to have an absorbance of light with a wavelength of around 365 nm, and to have a low or almost no absorbance of light with a wavelength of 375 nm or longer, preferably 390 nm or longer, are specifically referred to.

Some examples of the photo-polymerization initiator A' are benzyl ketal, α-hydroxyketone, α-aminoketone, acyl phosphineoxide, titanocene, oxyphenyl acetate, and oxime ester. Any of these initiators may be used either solely or in combination with one or more of any other initiators.

Some specific examples of the photo-polymerization initiator to initiate a polymerization by a methacrylate or vinyl group exposed to light are 2,2-dimethoxy-1,2-diphenylethane-1-one, 1-hydroxycyclohexylphenylketone, 2-hydroxy-2-methyl-1-phnylpropane-1-one, benzophenone, 1-[4-(2-hydroxyethoxy)phenyl]-2-hydroxy-2-methyl-1-propane-1-one, 2-methyl-1-[4-(methylthio)phenyl]-2-morpholinopropane-1-one, 2-benzyl-2-dimethylamino-1-(4-morpholinophenyl)butanone-1, bis(2,6-dimethoxybenzoyl)-2,4,4-trimethylpenthylphosphineoxide, 2-hydroxy-2-methyl-1-phenylpropane-1-one, and bis(2,4,6-trimethylbenzoyl)-phenyl phosphineoxide. Any of these initiators may be used either solely or in combination with one or more of any other initiators.

There is no specific limitation on photo-polymerization initiators A' as long as the initiator is an electrophilic reagent with a cationogen and able to cure an organic composition with light, and a conventional cationic photo-polymerization initiator may be used. Some examples of the initiator A' are iron-arene complex, aromatic diazonium salt, aromatic iodonium salt, aromatic sulfonium salt, pyridinium salt, aluminium salt or silyl ether, proton acid, and Lewis acid. Any of these initiators may be used either solely or in combination with one or more of any other initiators.

Some examples of a photo-curable polymerization initiator A' comprising a cationic photo-polymerization initiator initiating a polymerization with an ultraviolet light are IRGACURE 261 (a product of Ciba-Geigy Ltd.), Optmer SP-150 (a product of ADEKA CORPORATION), Optmer SP-151 (a product of ADEKA CORPORATION), Optmer SP-152 (a product of ADEKA CORPORATION), Optmer SP-170 (a product of ADEKA CORPORATION), Optmer SP-171 (a product of ADEKA CORPORATION), Optmer SP-172 (a product of ADEKA CORPORATION), UVE-1014 (a product of General Electric Company), CD-1012 (a product of Sartomer Company), San-Aid SI-60 L (a product of SANSHIN CHEMICAL INDUSTRY CO., LTD.) San-Aid SI-80 L (a product of SANSHIN CHEMICAL INDUSTRY CO., LTD.), San-Aid SI-100 L (a product of SANSHIN CHEMICAL INDUSTRY CO., LTD.), San-Aid SI-110 (a product of SANSHIN CHEMICAL INDUSTRY CO., LTD.), San-Aid SI-180 (a product of SANSHIN CHEMICAL INDUSTRY CO., LTD.), CI-2064 (a product of NIPPON SODA CO., LTD.), CI-2639 (a product of NIPPON SODA CO., LTD.), CI-2624 (a product of NIPPON SODA CO., LTD.), CI-2481 (a product of NIPPON SODA CO., LTD.), Uvacure 1590 (a product of DAICEL-UCB LTD.), Uvacure 1591 (a product of DAICEL-UCB LTD.), RHODORSILPhotoInitiator 2074 (a product of Rhone-Poulenc), UVI-6990 (a product of Union Carbide Corporation), BBI-103 (a product of Midori Kagaku Co., Ltd.), MPI-103 (a product of Midori Kagaku Co., Ltd.), TPS-103 (a product of Midori Kagaku Co., Ltd.), MDS-103 (a product of Midori Kagaku Co., Ltd.), DTS-103 (a product of Midori Kagaku Co., Ltd.), NAT-103 (a product of Midori Kagaku Co., Ltd.), NDS-103 (a product of Midori Kagaku Co., Ltd.), and CYRAURE UVI6990 (a product of Union Carbide Japan Corporation). Any of these initiators may be used either solely or in combination with one or more of any other initiators.

There is no specific limitation on methods for applying the photo-curable resin composition A, and the dispensing process, the inkjet process, the spray process, and the spin coat process can be used for the method of application. Among those examples, the spin coat process is preferable for its capability to form a thin film of the photo-curable resin composition A evenly on the surface of the substrate 3. An attention should be brought to FIG. 2A presenting a schematic illustration of a photo-curable resin composition A on the substrate 3 not a graphic image of a real state of the photo-curable resin composition A actually applied on the surface of the substrate 3.

<<Microstructure 2a>>

As illustrated in FIG. 2B, in the following method for forming a resin stamper, a prepared master stamper 5 (a master form of the resin stamper 2) is pressed against the photo-curable resin composition A applied on a surface of the substrate 3. As a result, the photo-curable resin composition A spreads across the surface of the substrate 3 conforming to the configuration of a microstructure 5a of the master stamper 5.

The electron beam lithography, the photo lithography, the convergent beam lithography, and the nanoimprinting process are some examples of methods for forming the microstructure 5a of the master stamper 5. A proper method among those methods may be determined in accordance with a required precision in processing of the microstructure 5a.

In the following step, as illustrated in FIG. 2C, while the master stamper 5 is being pressed against the photo-curable resin composition A, the composition A is exposed to light L1 with a first wavelength, which is emitted by an unillustrated light source, and which passes through the master stamper 5 before reaching the composition A. As a result, the microstructure 5a is transferred to the cured resin made of the photo-curable resin composition A when the photo-curable resin composition A is cured.

In the following step, as illustrated in FIG. 2D, the formation of the resin stamper 2 is completed when the resin layer 4 with the microstructure 2a is formed on the substrate 3 by removing the master stamper 5 from the cured resin made of the photo-curable resin composition A. The microstructure 2a formed on the resin stamper 2 has the reversed microscopic asperities of the microstructure 5a of the master stamper 5.

As described in detail later, on a surface of the microstructure 2a of the resin layer 4 of the resin stamper 2, an unillustrated mold releasing layer may be formed to facilitate the removal of the resin stamper 2 from the cured resin made of a photo-curable resin B (refer to FIG. 3B) of an impression receptor 7 (refer to FIG. 3D).

A conventional thin film made from such a surface lubricant preventing resins from clinging to the surface as fluoroplastics, silicone resin, hydrocarbon chain, diamond-like carbon, or a metal can be mentioned as a mold release layer.

The following description refers to FIGS. 3A to 3D, which are schematic explanatory views illustrating steps of a method for transferring a microstructure using the microstructure transferring device of FIG. 1.

Firstly, as illustrated in FIG. 3A, in the method for transferring, a microstructure, the resin stamper 2 is firmly held on a plate 6. Subsequently, on a surface of the impression receptor 7 disposed on a stage 8, the photo-curable resin composition B is applied with an unillustrated means.

<<Photo-curable Resin Composition B>>

A photo-curable resin composition B should be cured with light L2 (refer to FIG. 3C) with a wavelength, referred to as the second wavelength in the claims, emitted by the light source 1 (refer to FIG. 3C). The photo-curable resin composition B is preferably cured with light with a wavelength preferably of 375 nm or longer, more preferably, of 390 nm or longer.

The photo-curable resin composition B may have a composition comprising a photo-curable resin and the photo-polymerization initiator B'.

A similar resin to the photo-curable resin comprised in the photo-curable resin composition A may be used as a photo-curable resin comprised in the photo-curable resin composition B.

Among others, a resin with a methacryloyl group is preferred for the group's high reactivity.

Unlike the photo-curable resin comprised in the photo-curable resin composition A, however, a photo-curable resin comprised in the photo-curable resin composition B may be a resin containing a number of such carbon-carbon double bonds as in a phenyl or an alkylene group.

A photo-polymerization initiator B' used for the photo-curable resin composition B initiates a chemical reaction by a functional group of the photo-curable resin of the photo-curable resin composition B. The photo-polymerization initiator B' preferably has a higher absorbance of light with a wavelength of 375 nm or longer, preferably, 390 nm or longer than the photo-polymerization initiator A' of the photo-curable resin composition A.

Bis(2,4,6-trimethyl benzoyl)phenyl phosphine oxide (The brand name is IRGACURE 819, a product of Ciba-Specialty-Chemicals Ltd.), 2,4,6-trimethylbenzoyldiphenyl phosphine oxide (The brand name is DAROCUR TPO, a product of Ciba-Specialty-Chemicals Ltd.), 2-benzyl-2-dimethylamino-1-(4-morphorinophenyl)butanone-1 (The brand name is IRGACURE 369, a product of Ciba-Specialty-Chemicals Ltd.), 2-(dimethylamino)-2-[(4-methylphenyl) methyl]-1-[4-(4-morpholinyl)phenyl]-1-butanone (The brand name is IRGACURE 379, a product of Ciba-Specialty-Chemicals Ltd.), bis($\eta$5-2,4cyclopentadiene-1-yl)-bis(2,6-difluoro-3-(1H-pyrrole-1-yl)-phenyl)titanium (The brand name is IRGACURE 784, a product of Ciba-Specialty-Chemicals Ltd.), and 2-(o-benzoyloxime)-1-[4-(phenylthio) phenyl]-1-1,2-octanedione (The brand name is IRGACURE OXE 01, a product of Ciba-Specialty-Chemicals) are some examples of the photo-polymerization initiator B'. Especially, a range of wavelengths of light, which the photo-polymerization initiator B' is shown to absorb, preferably extends to 400 nm or longer. Any of these initiators may be used either solely or in combination with one or more of any other initiators. The photo-polymerization initiator B' remains to be an effective initiator even when the initiator is mixed with another polymerization initiator having a low or almost no absorbance of light with a wavelength of 375 nm or longer, especially of 390 nm or longer.

In the aforementioned description, the photo-polymerization initiator B' is assumed to absorb light with a wavelength range different from the light absorbed by the photo-polymerization initiator A'. In a particular concentration or composition, however, of the photo-polymerization initiator A' and the photo-polymerization initiator B' in the photo-curable resin composition A and the photo-curable resin composition B, the photo-polymerization initiator B' absorbing the light with the different wavelength range may not be used.

In a specific example, the concentrations of the photo-polymerization initiator B' may be adjusted so that the initiator B', which is contained in the photo-cured resin composition B in a predetermined concentration, may be contained in the photo-cured resin composition A in a lower concentration than in the photo-cured resin composition B. Thus, the prepared photo-curable resin composition A can be cured with light with the first wavelength, and can not or can hardly be cured with light with the second wavelength.

Addition of a sensitizer to a photo-curable resin composition B is a specific example of an adjustment of the compositions in order to make each of the photo-curable resin composition A and the photo-curable resin composition B start being cured with light with one of this predetermined wavelength range.

In other words, the photo-curable resin composition B, which may comprises a combination of the photo-curable resin and the photo-polymerization initiator B', may contain a photo-polymerization initiator A' with an added sensitizer in stead of the photo-polymerization initiator B' to prepare a photo-curable resin composition B comprising a combination of the photo-curable resin and the photo-polymerization of A' with the added sensitizer.

The sensitizer shows a sensitizing capability with light with a wavelength of, e.g., 375 nm or longer, preferably 390 nm or longer. Such anthracene derivative as 9,10-dibutoxy-anthracene, 9,10-diethoxyanthracene, 9,10-dipropoxyanthracene, and 9,10-bis(2-ethylhexyloxy)anthracene, as well as such thioxanthone type sensitizer as 2,4-diethylthioxanthone, 2-isopropylthioxanthone, and 4-isopropylthioxanthone are some specific examples of the sensitizer. Any of these sensitizers may be used either solely or in combination with one or more of any other sensitizers.

The longer is the wavelength (of the second wavelength) of the light emitted by the light source 1, the smaller is the amount of energy consumed in a process of curing the photo-curable resin composition. Therefore, the photo-curable resin composition B is preferably formed as a thin layer on a surface of an impression receptor 7 by a spin coat process or by pressing the resin stamper 2 against the composition B. Specifically, a preferable thickness of a film of the photo-curable resin composition B is 100 nm or smaller.

With another reference to FIG. 3, in the method for transferring a microstructure, a descent of a hoisting-lowering means (not shown) may transfer the resin stamper 2 toward the impression receptor 7 firmly held on the stage 8.

As a result, as illustrated in FIG. 3, the resin stamper 2 is pressed against the photo-curable resin composition B applied on the surface of the impression receptor 7. As a result, the photo-curable resin composition B spreads on the surface of the impression receptor 7 conforming to the configuration of the microstructure 2a of the resin stamper 2.

Subsequently, as illustrated in FIG. 3C, while the resin stamper 2 is pressed against the photo-curable resin composition B, the photo-curable resin composition B is exposed to the light L2, which is emitted by the light source 1, and which passes through the plate 6 and the resin stamper 2 before reaching the composition B. As a result, the transfer of the microstructure 2a of the resin stamper 2 to the cured resin made of the photo-curable resin composition B is completed when the photo-curable resin composition B is cured.

Figure 3D:
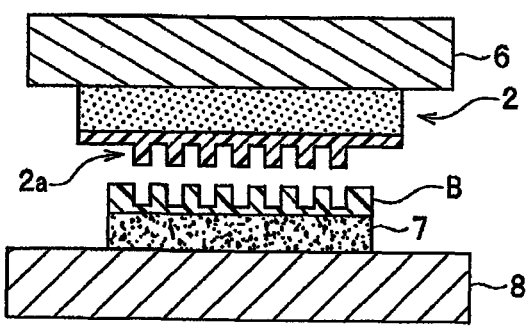

Subsequently, as illustrated in FIG. 3D, an ascent of the plate 6 by the hosting-lowering means (not shown) removes the stamper resin 2 from the cured resin made of the photo-curable resin composition B. In this manner, on the impression receptor 7, a microstructure, which is the reversed microstructure 2a, in other words, the same microstructure as the microstructure 5a (refer to FIG. 2D) of the master stamper 5 (refer to FIG. 2D) is formed.

While the impression receptor 7 with such a microstructure itself may be provided as a microstructure-bearing body, an impression receptor 7 having microscopic asperities corresponding to the microstructure, transferred to the cured resin made of the photo-curable resin composition B, may be also provided through an etching process applied to the impression receptor 7 using such cured photo-curable resin composition B as a mask.

Now, the advantages of the microstructure transferring device 10a and the method for transferring a microstructure will be described.

In the embodiment of the present invention, the resin layer 4 is formed by exposing and curing the photo-curable resin composition A to light with a wavelength of around 365 nm (the light L1 of the first wavelength) of a relatively high energy. Therefore, the curing process is highly efficient and a wider range of option for a photo-polymerization initiator A' is also provided.

In the embodiment of the present invention, the photo-polymerization initiator A' in the photo-curable resin composition A, which forms the resin layer 4 of the resin stamper 2, absorbs light with a wavelength of around 365 nm (the light L1 of the first wavelength) to show an initiating effect of starting a curing process of a photo-curable resin in the photo-curable composition A while showing a limited initiating effect with light with a wavelength longer than 365 nm (the light L2 of the second wavelength). The use of such photo-polymerization initiator A' enables the resin layer 4 as well as the resin stamper 2 to have an excellent transmittance of light with a wavelength longer than 365 nm, which is the light L2 of a wavelength longer than the first wavelength. As a result, the throughput of the microstructure transfer is improved due to the enhanced efficiency in curing the photo-curable resin composition B curable with the light L2 of the second wavelength on a surface of the impression receptor 7.

Moreover, in the embodiment of the present invention, a use of the plate 6 having a 50% or less of transmittance of light with a wavelength of around 365 nm, and 80% or more of transmittance of light with a wavelength of 375 nm or longer, preferably 390 nm or longer, further improves the throughput of the microstructure transfer due to the much enhanced efficiency in curing the photo-curable resin composition B.

In the embodiment of the present invention, the resin layer 4 prepared through a curing process is also likely to absorb the light L1 of the first wavelength, to which the photo-curable resin composition A is exposed to form the resin layer 4 of the resin stamper 2, and accordingly has a low transmittance of the light L1. Exposure of the resin layer 4 to light with a short wavelength of around 340 nm would cleave a carbon-carbon bond, which may constitute a main molecular structure in the cured resin made of the photo-curable resin composition A, which forms the resin layer 4, and a carbon-oxygen bond is cleaved with light with a wavelength of around 374 nm. Moreover, presence of such a conjugated double bond as olefin group in the cured resin made of the photo-curable resin composition A could form a factor of degradation of the cured resin vulnerable to oxidization caused by an ultraviolet light.

On the other hand, in the embodiment of the present invention, in order to expose and cure the photo-curable resin composition B (the second photo-curable resin composition), the light source 1 emits light with a wavelength of 375 nm or longer, preferably 390 nm or longer, which is longer than 365 nm. Therefore, the degradation of the resin stamper 2 can be prevented because the resin layer 4 is not exposed to light with such a short wavelength as around 365 nm of an ultraviolet light, which could cleave carbon-oxygen bonds as well as other chemical bonds present in the resin layer 4 of the resin stamper 2.

Moreover, in the embodiment of the present invention, the disposition of the optical filter at the plate 6 further prevents the degradation of the resin stamper 2 because the resin layer 4 is not exposed to light with a short wavelength, e.g., 365 nm of an ultraviolet light, which could cleave carbon-oxygen bonds as well as other chemical bonds present in the resin layer 4 of the resin stamper 2.

In the embodiment of the present invention, in order to expose and cure the photo-curable resin composition B (the second photo-curable resin composition), the light source 1 emits light with a wavelength of 375 nm or longer, preferably 390 nm or longer, which are longer than 365 nm. Therefore, the absorbance by the resin stamper 2 of light, to which the photo-curable resin composition B is exposed, and which is emitted by the light source 1 and passes through the resin stamper 2 and the plate 6 (a pressing member) before reaching the composition B, can be reduced.

Accordingly, thermal expansion of the microstructure 2a (a micro pattern) of the resin stamper 2 is suppressed leading to an excellent fidelity of the transfer of the microstructure 2a to the impression receptor 7.

In the embodiment of the present invention, to expose and cure the photo-curable resin composition B (the second photo-curable resin composition), the light source 1 emits light with a wavelength of 375 nm or longer, preferably 390 nm or longer, which are longer than 365 nm. Therefore, relaxed conditions, which should be met by the transmittance of the plate 6, the resin stamper 2, and the substrate 3, may diversify options for materials of those members, then, contributing to lowering the cost.

In the embodiment of the present invention, in order to expose and cure the photo-curable resin composition B (the second photo-curable resin composition), the light source 1 emits light with a wavelength of 375 nm or longer, preferably 390 nm or longer, which are longer than 365 nm. Therefore, the resin layer 4 of the resin stamper 2 may be thickened enhancing the comformability of the layer 4 to the impression receptor 7. As a result, the reception area for the transferred microstructure of the impression receptor 7 may be enlarged.

In the embodiment of the present invention, to expose and cure the photo-curable resin composition B (the second photo-curable resin composition), the light source 1 emits light with a wavelength of 375 nm or longer, preferably 390 nm or longer, which is longer than 365 nm. Therefore, the light source 1 suppresses heat generation. Accordingly, the light source 1 may require a simplified cooling system or no cooling system facilitating an enlargement of the light emission area of the light source 1.

In the embodiment of the present invention, the impression receptor 7 bearing a the transferred microstructure 2a (a micro pattern) may be applied to such information recording media as a magnetic recording medium and a photo recording medium. The impression receptor may also be applied to parts for a large scale integrated circuit, such optical devices as a lens, a polarizing plate, a colour filter, a light emitting element, and a photo integrated circuit, and such bio devices as an immunity analysis, a DNA isolation, and a cell culture.

The aforementioned description of embodiments is not meant to limit the scope of the embodiments of the present invention, which may be worked in other various embodiments.

Apart from the aforementioned embodiment of FIG. 1 illustrating the microstructure transferring device 10, which is provided with one resin stamper 2 to transfer the microstructure 2a to only one of two faces of the impression receptor 7, the impression receptor 7 of the present invention may bear the transferred microstructure 2a on each of both faces.

Figure 4:
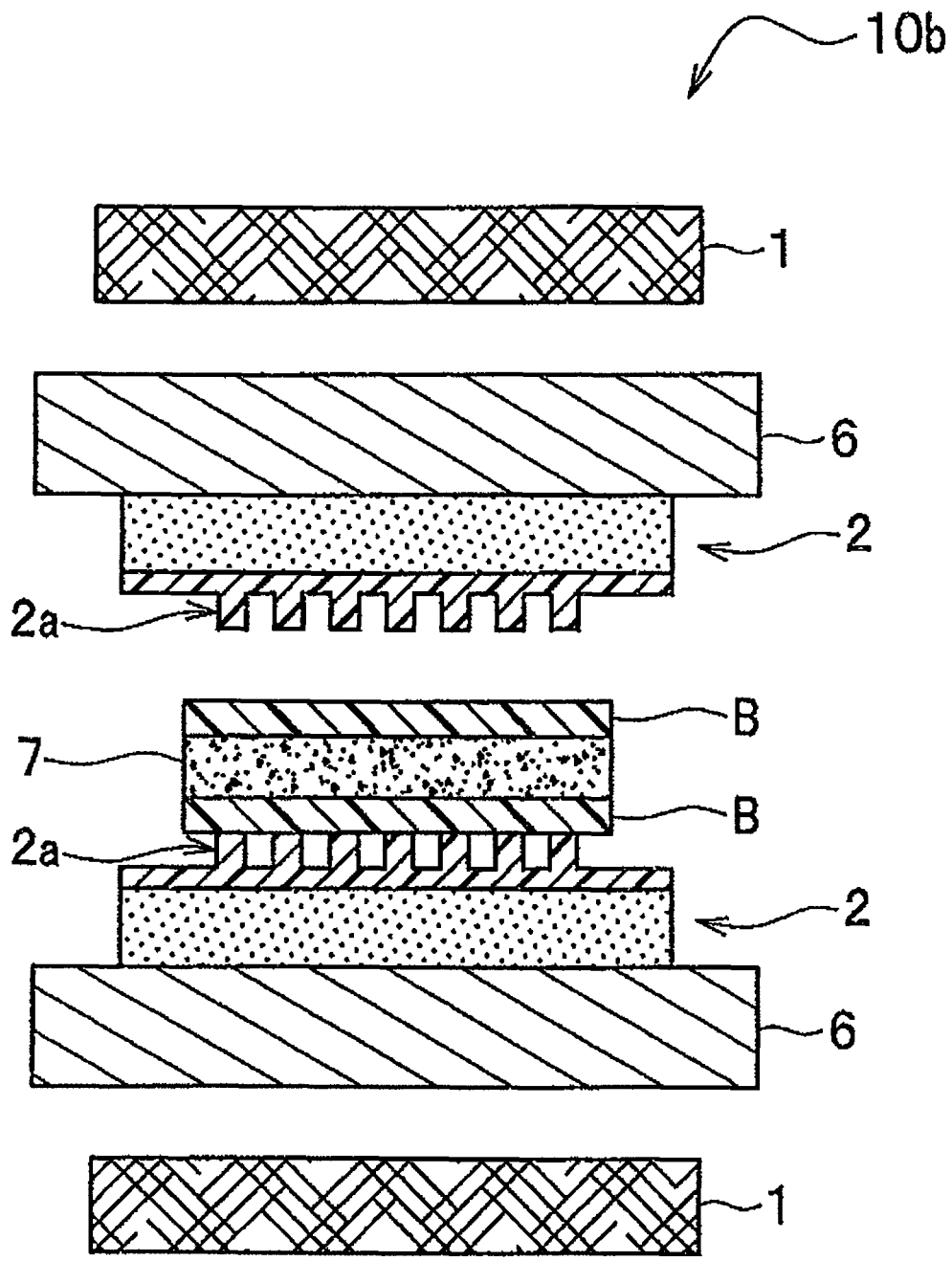
FIG. 4 is an explanatory view of a configuration of a microstructure transferring device of another embodiment of the present invention.

The following description refers to FIG. 4, which is an explanatory view of a configuration of a microstructure transferring device of another embodiment of the present invention.

As illustrated in FIG. 4, a microstructure transferring device 10 is provided with an impression receptor 7 with a photo-curable resin composition B applied on both faces. The impression receptor 7 is disposed between a opposing pair of resin stampers 2,2, which in turn are disposed between a opposing pair of plates 6,6 (pressing members), which are further disposed between a opposing pair of light sources 1,1.

The microstructure transferring device 10b is provided with the hoisting-lowering device (not shown) at, at least, one of the pair of plates 6,6.

In such microstructure transferring device 10b, an unillustrated application means supplies both faces of the impression receptor 7 with the photo-curable resin composition B, and subsequently the impression receptor 7 is placed on the lower resin stamper 2. In the following step, the hoisting-lowering device (not shown) transfers the pair of plates 6,6 towards the impression receptor 7 so that the impression receptor 7 may be sandwiched between the pair of resin stampers 2, 2. In the following unillustrated step, while the impression receptor 7 remains sandwiched by the pair of resin stampers 2,2, the photo-curable resin composition B on each of both faces of the impression receptor 7 is exposed to light with the second wavelength emitted by either of the pair of the light source 1,1. As a result, the microstructure 2a of the resin stamper 2 is transferred to each of both faces of the impression receptor 7 when the photo-curable resin composition B is cured. Subsequently, the hoisting-lowering device (not shown), which transfers the pair of plates 6,6 parting from each other and from the impression receptor 7, removes the pair of resin stampers 2,2 from the impression receptor 7 to provide a microstructure-bearing body comprising the impression receptor 7 bearing the transferred microstructure 2a on each of both faces.

The microstructure transferring device 10a, 10b of the present invention may also be further provided with an alignment means to carry out positioning of the resin stamper 2 and the impression receptor 7. A conventional alignment means is properly employed as the alignment means of the present invention, and an optical alignment means and a mechanical alignment means are some examples of the alignment means.

Moreover, for the formation of the resin stamper 2, the microstructure transferring method of the present invention comprises the step of pressing the master stamper 5 against the photo-curable resin composition A supplied to the substrate 3; nevertheless, the method of the present invention may comprise a step of pressing the substrate 3 against the photo-curable resin composition A supplied to the master stamper 5.

In the microstructure transferring method of the present invention, in the step of making the resin stamp 2 and the impression receptor 7 contact each other, they may be allowed to contact after the surfaces of the resin stamp 2 and of the receptor 7 are treated under a reduced pressure or exposed to an atmosphere of gas such as nitrogen. Such microstructure transferring method facilitates the curing process of the photo-curable resin composition B supplied to a surface of the impression receptor 7.

WORKING EXAMPLES

In the following paragraphs, the present invention will be more specifically described with presentation of working examples.

Working Example 1

In the following working example 1, a resin stamper was formed by curing the photo-curable resin composition A (the first photo-curable resin composition) with light with the first wavelength before a microstructure-bearing body was obtained by curing, with the light L2 with the second wavelength, the photo-curable resin composition B (the second photo-curable resin composition) supplied to an impression receptor while the resin stamper was pressed against the supplied photo-curable resin B.

The prepared photo-curable resin composition A comprised 100 parts by mass of OX-SQ (a product of TOAGOSEI CO., LTD.) mixed with 5 parts by mass of ADEKAOPTOMER SP-152 (a product of ADEKA CORPORATION) as a photo-polymerization initiator A'.

A master stamper and a substrate were prepared for the formation of a resin stamper.

The master stamper bore a concentric circle pattern with a line width of 50 nm, a pitch of 100 nm, and a height of 50 nm, formed by a conventional electron beam lithography on a silicon wafer with a thickness of 0.675 mm and a diameter of 150 mm in the region between an inner circle with a diameter of 25 mm and an outer circle with a diameter of 60 mm. The surface of the master stamper was treated with OPTOOL DSX (a product of DAIKIN INDUSTRIES, Ltd.) as a releasing agent.

A quartz substrate with a thickness of 0.7 mm and a diameter of 100 mm was used as a substrate.

Firstly, with a pipette, 0.3 mL of the photo-curable resin composition A was dropped at the centre of the master stamper. Secondly, the photo-curable resin composition A was pressed with the substrate to spread across the master stamper, then, the rear face of the substrate was exposed for 2 minutes to light with a wavelength of 365 nm (the first light L1 of the first wavelength) emitted by an LED lamp before the master stamper was removed from the substrate to obtain a body bearing the master stamper's microstructure transferred to the cured resin made of the photo-curable resin composition A.

The average thickness of the resin layer was measured with a stylus profilometer. The resin layer was cut, with a knife, off the substrate of the resin stamper prepared under the aforementioned conditions to be provided for the measurement. The measured average thickness was 30 µm. A spectrophotometer was used for a measurement of the prepared resin stamper's transmittance. The measured transmittance was 75% of light with the wavelength of 365 nm, 82% of 375 nm, 90% of 390 nm, and 93% of 400 nm.

No carbon-carbon double bond in the composition of the resin layer was observed in an analysis of carbon chemical bonds based on a C1s spectrum produced by an x-ray molecular spectroscopy on the surface of the resin layer of the resin stamper prepared under the aforementioned conditions.

In the present example, when the photo-curable resin composition A was exposed for 10 minutes to light with a wavelength of 390 nm emitted by an LED lamp with a illuminance of 30 mWcm$^{-2}$, the photo-curable resin composition A was not thoroughly cured.

Subsequently, a microstructure was transferred to the photo-curable resin composition B using the prepared resin stamper.

The prepared photo-curable resin composition B comprised 100 parts by mass of UA-53H (a product of Shin-Nakamura Chemical Co., Ltd) as urethane acrylate mixed with 5 parts by mass of IRGACURE 819 (a product of Ciba-Specialty-Chemicals Ltd.) as a photo-polymerization initiator B'.

Firstly, a silicon wafer with a thickness of 0.38 mm and a diameter of 76.2 mm was used as an impression receptor, and a quartz glass with a thickness of 20 mm and a diameter of 75 mm, provided with Sylgard (a registered trademark) 184 (a product of Dow Corning Corporation) with a thickness of 20 mm and a diameter of 75 mm as a shock absorbance layer, was used as the plate. A spectrophotometer measured the prepared plate's transmittance of 80% of light with the wavelength of 365 nm, 84% of 375 nm, 89% of 390 nm, and 92% of 400 nm. A stage was made of stainless steel.

The light source was disposed above the plate. The employed light sources were a pair of LED lamps emitting light with a wavelength of 400 nm and disposed side by side. The measured illuminance at the point around the centre of the disposition of the impression receptor was 70 mWcm$^{-2}$.

Firstly, the resin stamper was firmly held on the plate, and the impression receptor on the stage. The photo-curable resin composition B was, in advance, applied with the spin coat process to the impression receptor to form thereon a film with a thickness of 40 nm.

Secondly, a descent of the plate pressed the resin stamper against the photo-curable resin composition B on the impression receptor to conform the photo-curable resin composition B to the configuration of the microstructure of the resin stamper spreading the composition B across the surface of the receptor.

In the next step, the photo-curable resin composition B was cured by exposing the composition B for 10 seconds to light emitted by the light sources and passing through the plate and the resin stamper before reaching the composition B.

Figure 5:
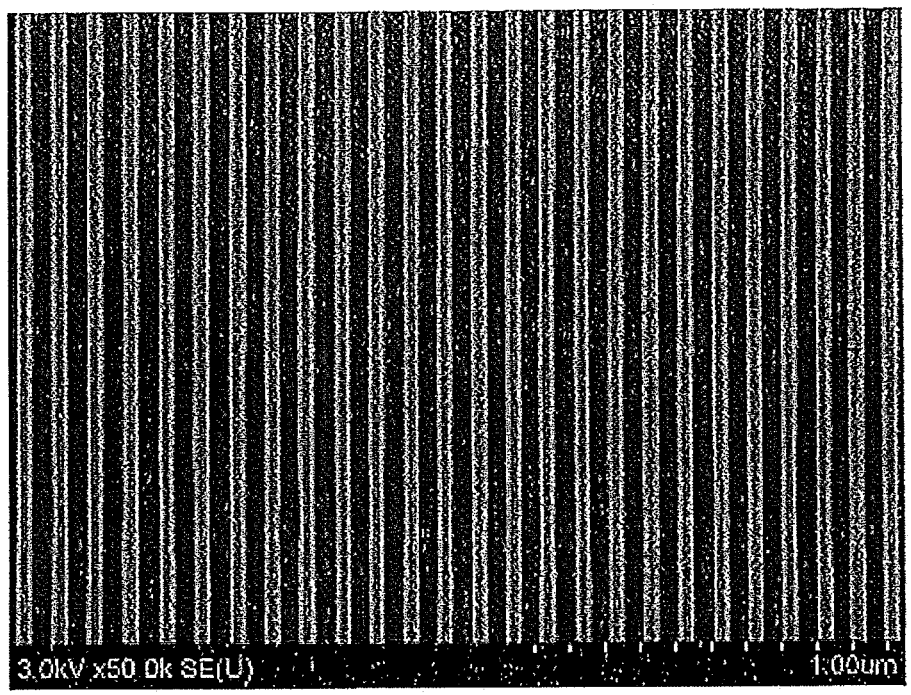
FIG. 5 is an electron micrograph of a microstructure produced according to one of the working examples of the present invention.

Subsequently, an ascent of the plate removed the resin stamper from the impression receptor. A subsequent observation of the surface of the impression receptor revealed a recognizable transferred microstructure, which had reversed microscopic asperities of the microstructure of the resin stamper. FIG. 5 shows an SEM image of the microstructure.

In Working Example 1, a repeated use of the prepared resin stamper for 500 times on the photo-curable resin composition B produced transferred microstructures, which showed a dimensional variation of no more than ±2 nm.

Working Example 2

In Working Example 2, a microstructure was transferred to the photo-curable resin composition B in the same procedures as Working Example 1 except that the LED lamp emitting light with the wavelength of 400 nm in Working Example 1 was replaced with an LDE emitting light with a wavelength of 375 nm. As a result, a transferred microstructure, which had reversed microscopic asperities of the microstructure of the resin stamper, was recognized on the surface of the impression receptor.

In Working Example 2, a repeated use of the prepared resin stamper for 500 times on the photo-curable resin composition B produced transferred microstructures, which showed a dimensional variation of no more than ±2 nm.

Working Example 3

In Working Example 3, a microstructure was transferred to the photo-curable resin composition B in the same procedures as Working Example 1 except that the photo-curable resin composition B of Working Example 1 was replaced with a prepared photo-curable resin composition B comprising 100 parts by mass of UA-53H (a product of Shin-Nakamura Chemical Co., Ltd) as urethane acrylate mixed with 4.5 parts by mass of IRGACURE 903 (a product of Ciba-Specialty-Chemicals Ltd.) as a photo-polymerization initiator B' and with 0.5 parts by mass of 2-isopropylthioxanthone (a product of TOKYO OHKA KOGYO CO., LTD.) as another initiator. As a result, a transferred microstructure, which had reversed microscopic asperities of the microstructure of the resin stamper, was recognized on the surface of the impression receptor.

In Working Example 3, a repeated use of the prepared resin stamper for 500 times on the photo-curable resin composition B produced transferred microstructures, which showed a dimensional variation of no more than ±2 nm.

Working Example 4

In Working Example 4, the employed plated comprised the plate employed in Working Example 1 and LU 0385 (a product of Asahi Spectra Co., Ltd) as an optical filter attached to the plate to filter out light with any wavelength of 385 nm or shorter.

The optical filter had a transmittance of 0.04% of light with a wavelength of 365 nm, 0.8% of 375 nm, 94% of 390 nm, and 95% of 400 nm. A microstructure was transferred to the photo-curable resin composition B in the same procedures as Working Example 1 except that the optical filter was attached to the plate in the present working example. As a result, a transferred microstructure, which had reversed microscopic asperities of the microstructure of the resin stamper, was recognized on the surface of the impression receptor.

In Working Example 4, a repeated use of the prepared resin stamper for 500 times on the photo-curable resin composition B produced transferred microstructures, which showed a dimensional variation of no more than ±2 nm.

Working Example 5

In Working Example 5, a microstructure was transferred to the photo-curable resin composition B in the same procedures as Working Example 1 except that the substrate of the resin stamper of Working Example 1 was replaced with an acrylic board with a thickness of 0.7 mm, a length of 120 nm, and a width of 80 nm as a substrate. The prepared resin stamper had a transmittance of 50% of light with a wavelength of 365 nm, 60% of 375 nm, 92% of 390 nm, and 95% of 400 nm. As a result, a transferred microstructure, which had reversed microscopic asperities of the microstructure of the resin stamper, was recognized on the surface of the impression receptor.

In Working Example 5, a repeated use of the prepared resin stamper for 500 times on the photo-curable resin composition B produced transferred microstructures, which showed a dimensional variation of no more than ±2 nm.

Working Example 6

In Working Example 6, a microstructure was transferred to the photo-curable resin composition B in the same procedures as Working Example 1 except that the plate of Working Example 1 was replaced with an acrylic board with a thickness of 10 mm, a length of 120 nm, and a width of 80 nm as a plate. The employed plate had a 30% in transmittance of light with a wavelength of 365 nm, 45% of 375 nm, 82% of 390 nm, and 84% of 400 nm. As a result, a transferred microstructure, which had reversed microscopic asperities of the microstructure of the resin stamper, was recognized on the surface of the impression receptor.

In Working Example 6, a repeated use of the prepared resin stamper for 500 times on the photo-curable resin composition B produced transferred microstructures, which showed a dimensional variation of no more than ±2 nm.

Working Example 7

In Working Example 7, the photo-curable resin composition A, used for the preparation of the resin stamper of Working Example 1, was replaced with a photo-curable resin composition A comprising 60 parts by mass of EHPE 3150 (a product of DAICEL CORPORATION) and 40 parts by mass of neopentylglycol diglycidyl ether (a product of TOKYO CHEMICAL INDUSTRY CO., LTD.) mixed with 5 parts by mass of ADEKAOPTOMER SP-300 (a product of ADEKA CORPORATION) as a photo-polymerization initiator A'. A resin stamper, prepared in the same procedures as Working Example 1 except the replacement of the photo-curable resin composition A, was further treated with OPTOOL DSX (a product of DAIKIN INDUSTRIES, Ltd.) as a releasing agent. The prepared resin stamper had a transmittance of 70% of light with a wavelength of 365 nm, 80% of 375 nm, 92% of 390 nm, and 95% of 400 nm. No carbon-carbon double bond in the composition of the resin layer was observed in an analysis of carbon chemical bonds based on a C1s spectrum produced by an x-rays molecular spectroscopy on the surface of the resin layer of the prepared resin stamper.

A microstructure was transferred to the photo-curable resin composition B in the same procedures as Working Example 1 except that the resin stamper of Working Example 1 was replaced with the resin stamper of the present example. As a result, a transferred microstructure, which had reversed microscopic asperities of the microstructure of the resin stamper, was recognized on the surface of the impression receptor.

In Working Example 7, a repeated use of the prepared resin stamper for 500 times on the photo-curable resin composition B produced transferred microstructures, which showed a dimensional variation of no more than ±2 nm.

Working Example 8

In Working Example 8, the photo-curable resin composition A, used for the preparation of the resin stamper of Working Example 1, was replaced with a photo-curable resin composition A comprising 60 parts by mass of UV-7630B (a product of The Nippon Synthetic Chemical Industry Co., Ltd.) and 40 parts by mass of neopentylglycol diacrylate (a product of TOKYO CHEMICAL INDUSTRY CO., LTD.) mixed with 5 parts by mass of DAROCUR1173 (a product of Ciba-Specialty-Chemicals Ltd.) as a photo-polymerization initiator A'. A resin stamper, prepared in the same procedures as Working Example 1 except the replacement of the photo-curable resin composition A, was treated with OPTOOL DSX (a product of DAIKIN INDUSTRIES, Ltd.) as a releasing agent. The prepared resin stamper had a transmittance of 75% of light with a wavelength of 365 nm, 80% of 375 nm, 91% 390 nm, and 93% 400 nm.

A microstructure was transferred to the photo-curable resin composition B in the same procedures as Working Example 1 except that the resin stamper of Working Example 1 was replaced with the resin stamper of the present example. As a result, a transferred microstructure, which had reversed microscopic asperities of the microstructure of the resin stamper, was recognized on the surface of the impression receptor.

In Working Example 8, a repeated use of the prepared resin stamper for 50 times on the photo-curable resin composition B produced transferred microstructures, which showed a dimensional variation of no more than ±3 nm.

Working Example 9

Working Example 9 is different from Working Example 1 in the ingredients of the stamper-forming photo-curable resin composition A and the photo-curable resin composition B, and in the application process of the photo-curable resin B to the impression receptor.

In Working Example 9, a resin stamper was prepared in the same procedure as Working Example 1 except the prepared photo-curable resin composition A comprising 60 parts by mass of UV-7630B (a product of The Nippon Synthetic Chemical Industry Co., Ltd.) and 40 parts by mass of neopentylglycol diacrylate (a product of TOKYO CHEMICAL INDUSTRY CO., LTD.) mixed with 5 parts by mass of IRGACURE 379 (a product of Ciba-Specialty-Chemicals Ltd.) as a photo-polymerization initiator A'. The prepared resin stamper had a transmittance of 70% of light with the wavelength of 365 nm, 80% of 375 nm, 92% 390 nm, and 93% 400 nm.

The prepared photo-curable resin composition B comprised 15 parts by mass of UV-7630B (a product of The Nippon Synthetic Chemical Industry Co., Ltd.) and 85 parts by mass of neopentylglycol diacrylate (a product of TOKYO CHEMICAL INDUSTRY CO., LTD.) mixed with 5 parts by mass of IRGACURE 379 (a product of Ciba-Specialty-Chemicals Ltd.) as a photo-polymerization initiator A'.

In Working Example 9, the impression receptor was supplied with the photo-curable resin composition B with a inkjet device. The employed inkjet device had 512 nozzle heads disposed in two lines each having 256 nozzle heads to eject the resin in a piezoelectric method. The intervals between two neighbouring nozzles along the line were 70 μm, and the two lines were 140 μm apart from each other. Each nozzle was so adjusted as to eject about 5 pL of the photo-curable resin composition B. The photo-curable resin composition B was dropped so that the deposition might form concentric circles with a pitch of 140 µm along the radius and 280 µm along the circumference.

A microstructure was transferred to the photo-curable resin composition B in the same procedures as in Working Example 1 except that the above-mentioned photo-cured resin composition A, photo-cured resin composition B, and application process of the photo-cured resin composition B were used. As a result, a transferred microstructure, which had reversed microscopic asperities of the microstructure of the resin stamper, was recognized on the surface of the impression receptor.

In Working Example 9, a repeated use of the prepared resin stamper for 50 times on the photo-curable resin composition B produced transferred microstructures, which showed a dimensional variation of no more than ±3 nm.

Working Example 10

Working Example 10 employed a resin stamper of Working Example 1 with a thicker resin layer as the resin stamper 2. Specifically, a resin stamper was prepared in the same procedure as Working Example 1 except 1 mL of the ejected amount of the photo-curable resin composition A instead of 0.3 mL in Working Example 1. The average thickness of resin layer, measured in the same means as Working Example 1, was 120 µm. The prepared resin stamper 2 had a transmittance of 44% of light with the wavelength of 365 nm, 50% of 375 nm, 82% of 390 nm, and 85% of 400 nm.

A microstructure was transferred to the photo-curable resin composition B in the same procedures as Working Example 1 except. that the above-mentioned resin stamper was used. As a result, a transferred microstructure, which had reversed microscopic asperities of the microstructure of the resin stamper, was recognized on the surface of the impression receptor.

In Working Example 10, a repeated use of the prepared resin stamper for 500 times on the photo-curable resin composition B produced transferred microstructures, which showed a dimensional variation of no more than ±2 nm.

Working Example 11

In Working Example 11, the master stamper bore a line-and-space pattern with a line width of 50 nm, a pitch of 100 nm, and a height of 50 nm, formed by a conventional electron beam lithography on a silicon wafer with a thickness of 0.775 mm and a diameter of 300 mm in the region shaped in a square with a side of 200 mm in the center of the silicon wafer. The surface of the master stamper was treated with OPTOOL DSX (a product of DAIKIN INDUSTRIES, Ltd.) as a releasing agent.

A quartz substrate with a thickness of 0.7 mm and a diameter of 200 mm was used as the substrate.

Firstly, with a pipette, 10 mL of the photo-curable resin composition A was dropped at the centre of the master stamper. Secondly, the photo-curable resin composition A was pressed with the substrate to spread across the surface of the master stamper, then, the rear face of the substrate was exposed for 2 minutes to light with a wavelength of 365 nm (the first light L1 of 365 nm) emitted by an LED lamp before the master stamper was removed from the substrate to obtain a microstructure-bearing body bearing the master stamper's microstructure transferred to the cured resin made of the photo-curable resin composition A.

The average thickness of the resin layer was measured with a stylus profilometer. The resin layer was cut, with a knife, off the substrate of the resin stamper prepared under the aforementioned conditions to be provided for the measurement. The measured average thickness was 120 µm. A spectrophotometer was used for a measurement of the prepared resin stamper's transmittance The measured transmittance was 44% of light with the wavelength of 365 nm, 50% of 375 nm, 82% of 390 nm, and 85% of 400 nm.

In Working Example 11, the employed impression receptor is a silicon wafer with a thickness of 0.625 mm and a diameter 150 mm.

A microstructure was transferred to the photo-curable resin composition B in the same procedures as Working Example 1 except the resin stamper and the impression receptor. As a result, a transferred microstructure, which had reversed microscopic asperities of the microstructure of the resin stamper, was recognized on the entire surface of the impression receptor.

In Working Example 11, a repeated use of the prepared resin stamper for 500 times on the photo-curable resin composition B produced transferred microstructures, which showed a dimensional variation of no more than +2 nm.

Working Example 12

Working Example employed two of the same resin stampers as the resin stamper formed in Working Example 11.

The resin stamper was used in an assembly of a same microstructure transferring device 10b as illustrated in FIG. 4.

The prepared impression receptor 7 illustrated in FIG. 4 was a glass substrate designed for a magnetic recording media with a diameter of 65 mm, a thickness of 0.63 mm, and a central hole with a diameter of 20 mm. The present example employed a pair of the plates 6 and of the light sources 1, both of which were same as the plate and the light source of Working Example 1.

Firstly, as illustrated in FIG. 4, each of the two resin stampers 2 was firmly held on each of the upper and lower plates 6, 6. Secondly, the photo-curable resin composition B was applied with a spin coat process to each of the two faces of the impression receptor 7 to form thereon a film with a thickness of 40 nm. Subsequently, the impression receptor 7 was placed on the lower resin stamper 2.

In the following step, a descent of the upper plate 6 pressed the upper resin stamper 2 against the photo-curable resin composition B applied to the upper face of the impression receptor 7 in order to apply pressure on the impression receptor 7 sandwiched between the upper and lower resin stampers 2, 2.

While the impression receptor 7 remained sandwiched between the resin stampers 2, 2, the photo-curable resin composition B on each of the two faces of the impression receptor 7 was cured by exposing the composition B for 10 seconds to light L2 with the second wavelength emitted by each of the two light sources 1, 1. Subsequently, an ascent of the upper plate 6 removed the upper and lower resin stampers 2, 2 from the impression receptor 7.

An observation of the two surfaces of the impression receptor 7 revealed a recognizable transferred microstructure, which had reversed microscopic asperities of the microstructure 2a of the resin stamper 2.

In Working Example 12, a repeated use of the prepared resin stamper for 500 times on the photo-curable resin composition B produced transferred microstructures, which showed a dimensional variation of no more than ±2 nm.

COMPARATIVE EXAMPLES

Comparative Example 1

Comparative Example 1 used the photo-curable resin composition comprising 100 parts by mass of UA-53H (a product of Shin-Nakamura Chemical Co., Ltd) as urethane acrylate mixed with 5 parts by mass of DAROCUR1173 (a product of Ciba-Specialty-Chemicals Ltd.) instead of the photo-curable resin composition B of Working Example 1. Subsequently, as in Working Example 1, while the resin stamper remained pressed against the photo-curable resin composition B applied to the impression receptor, the composition B was exposed for 2 minutes to light with a wavelength of 390 nm emitted by the light source with a illuminance of $25\ mWcm^{-2}$; nevertheless, the photo-curable resin composition B was not cured. It should be noted that DAROCUR1173 itself has little absorbance of light with a wavelength of 390 nm.

Comparative Example 2

Unlike Working Example 1 using the resin stamper 2 made of the photo-curable resin composition A, Comparative Example 2 employed a resin stamper comprising polyolefine as a thermoplastic resin.

In the present example, firstly, a thin polyolefine film with a thickness of 0.5 μm was formed on a surface of a substrate. Secondly, a pressure of $10\ kgf/cm^2$ (981 kPa) was applied on a same master stamper as used in Working Example 1 for 3 minutes at a transferring temperature of 200 centigrade to press the stamper against the thin polylefine film. After cooling down to 60 centigrade, the master stamper was removed from the thin polyolefine film to provide the resin stamper.

An observation with a scanning electron microscope on a surface of the resin stamper revealed blunt edges of the microstructure indicating a deteriorated fidelity of the thermoplastic resin.

In the following step, a microstructure was transferred to the photo-curable resin composition B using the prepared resin stamper 2 in the same procedures as Working Example 1. Although the photo-curable resin composition B was cured, an observation with a scanning electron microscope revealed increasingly blunter edges of the microstructure of transferred to the cured resin made of the photo-curable resin composition B indicating a further deteriorated fidelity in pattern forming.

LIST OF REFERENCE NUMERALS AND SIGNS 1 light source
2 resin stamper
2a microstructure
3 substrate
4 resin layer
5 master stamper
5a microstructure
6 plate
7 impression receptor
10a microstructure transferring device
10b microstructure transferring device
A photo-curable resin composition (first photo-curable resin composition)
B photo-curable resin composition (second photo-curable resin composition)
L1 light (light with first wavelength)
L2 light (light with second wavelength)

What is claimed is:

1. A microstructure transferring device for transferring a microstructure to a photo-curable resin composition supplied to an impression receptor comprising:
    a stamper having the microstructure configured to be pressed against a second photo-curable resin composition applied to the impression receptor and removed from the supplied second photo-curable resin composition after cured;
    a light source emitting a second wavelength light, whose wavelength is longer than a first wavelength, the second wavelength light being capable of curing the second photo-curable resin composition, and being configured to pass through the stamper to the second photo-curable resin composition while the stamper is being pressed against the second photo-curable resin composition supplied to the impression receptor in order to cure the supplied second photo-curable resin composition;
    a pressing member configured to press the stamper against the second photo-curable resin composition supplied to the impression receptor; and
    an optical filter, which is disposed at the pressing member, and which absorbs light with a range of wavelengths shorter than the second wavelength,
    wherein the light source is configured to expose the second photo-curable resin composition supplied to the impression receptor to light passing through the optical filter before reaching the second photo-curable resin composition, and
    wherein
    the stamper is formed by pressing, against a first photo-curable resin composition, a master stamper having the microstructure, by curing the first photo-curable resin composition by exposing the first photo-curable resin composition to light with the first wavelength, and by removing the master stamper from the cured first photo-curable resin composition.

2. A microstructure transferring system comprising:
    a first microstructure transferring device for producing a stamper, including:
        a master stamper having a microstructure configured to be pressed against a first photo-curable resin composition and removed from the first photo-curable resin composition after the first photo-curable resin composition is cured,
        a first light source emitting a first light of a first wavelength to cure the first photo-curable resin composition; and
    a second microstructure transferring device configured to transfer the microstructure to a second photo-curable resin composition applied to an impression receptor including:
        the stamper configured to be pressed against the second photo-curable resin composition applied to the impression receptor and removed from the applied second photo-curable resin composition after the applied second photo-curable resin composition is cured;
        a second light source emitting a second light of a second wavelength being longer than the first wavelength, the second light being capable of curing the second photo-curable resin composition, and being configured to pass through the stamper to the second photo-curable resin composition while the stamper is being pressed against the second photo-curable resin composition applied to the impression receptor in order to cure the applied second photo-curable resin composition;

a pressing member configured to press the stamper against the second photo-curable resin composition applied to the impression receptor; and an optical filter provided on the pressing member, the optical filter absorbing light with a range of wavelengths shorter than the second wavelength, and being configured so that the second light passes through the optical filter before reaching the second photo-curable resin composition applied to the impression receptor.

3. The system of claim 2, wherein the device is further provided with a pressing member to press the stamper against the second photo-curable resin composition supplied to the impression receptor, wherein the pressing member has a transmittance of 50% or less of light with the first wavelength and 80% or more of light with the second wavelength.

4. The system of claim 3, wherein the LED light source emits light with a wavelength of 375 nm or longer.

5. The system of claim 3, wherein the LED light source emits light with a wavelength of 390 nm or longer.

6. The system of claim 2, wherein the optical filter has a transmittance of 1% or less of light with a wavelength of 350 nm or shorter.

7. The system of claim 2, wherein the stamper has a transmittance of 50% or less of light with the first wavelength and an 80% or more of light with the second wavelength.

8. The system of claim 2, wherein the light source is an LED light source emitting light with a longer wavelength than a wavelength of light absorbed by a photo-polymerization initiator contained in the first photo-curable resin composition.

9. The system of claim 2, wherein a wavelength of light absorbed by a photo-polymerization initiator contained in the second photo-curable resin composition is longer than a wavelength of light absorbed by a photo-polymerization initiator contained in the first photo-curable resin composition.

10. The system of claim 2, wherein a photo-polymerization initiator contained in the second photo-curable resin composition has a higher absorbance of light with the second wavelength than a photo-polymerization initiator contained in the first photo-curable resin composition.

11. The system of claim 2, wherein the difference between the first wavelength and the second wavelength is 10 nm or more.

12. The system of claim 2, wherein the difference between the first wavelength and the second wavelength is 25 nm or more.

13. A microstructure transferring system comprising:
a first microstructure transferring device for producing a stamper, including
a master stamper having a microstructure configured to be pressed against a first photo-curable resin composition and removed from the first photo-curable resin composition after the first photo-curable resin composition is cured,
a first light source emitting a first light of a first wavelength to cure the first photo-curable resin composition; and
a second microstructure transferring device configured to transfer the microstructure to a second photo-curable resin composition applied to each of two sides of an impression receptor, including:
a pair of the stampers each configured to be pressed against the second photo-curable resin composition applied to each of the two sides of the impression receptor, and being removed from the applied second photo-curable resin composition after the applied second photo-curable resin composition is cured;
a pair of second light sources each emitting a second light of a second wavelength being longer than the first wavelength, the second light being capable of curing the second photo-curable resin composition, and passing through the stamper to the second photo-curable resin composition while each of the stampers is being pressed against the second photo-curable resin composition applied to each of the two sides of the impression receptor in order to cure the applied second photo-curable resin composition;
a pair of pressing members each configured to press the stamper against the second photo-curable resin composition applied to the impression receptor; and
a pair of optical filters each provided on the pressing member, and each of the optical filter absorbing light with a range of wavelengths shorter than the second wavelength, and being configured so that the second light passes through the optical filter before reaching the second photo-curable resin composition applied to the impression receptor.

14. The system of claim 13, wherein the system is further provided with a pair of pressing members, each of the pair of pressing members configured to press the stamper against the second photo-curable resin composition applied to the impression receptor, wherein the pressing member has a transmittance of 50% or less of light with the first wavelength and a 80% or more of light with the second wavelength.

15. The system of claim 13, wherein each of the pair of optical filters has a transmittance of 1% or less of light with a wavelength of 350 nm or shorter.

16. The system of claim 13, wherein each of the pair of stampers has a transmittance of 50% or less of light with the first wavelength and an 80% or more of light with the second wavelength.

17. The system of claim 13, wherein each of the pair of second light sources is an LED light source emitting light with a longer wavelength than a wavelength of light absorbed by a photo-polymerization initiator included in the first photo-curable resin composition.

* * * * *